US010284233B2

(12) United States Patent
Bazarsky et al.

(10) Patent No.: US 10,284,233 B2
(45) Date of Patent: *May 7, 2019

(54) ECC ADJUSTMENT BASED ON DYNAMIC ERROR INFORMATION

(71) Applicant: WESTERN DIGITAL TECHNOLOGIES, INC., Irvine, CA (US)

(72) Inventors: Alexander Bazarsky, Holon (IL); Eran Sharon, Rishon Lezion (IL); Ariel Navon, Revava (IL)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 59 days.

This patent is subject to a terminal disclaimer.

(21) Appl. No.: 15/408,823

(22) Filed: Jan. 18, 2017

(65) Prior Publication Data

US 2018/0159559 A1    Jun. 7, 2018

Related U.S. Application Data (63) Continuation-in-part of application No. 15/371,167, filed on Dec. 6, 2016.

(51) Int. Cl.
*H03M 13/00* (2006.01)
*H03M 13/35* (2006.01)
(Continued)

(52) U.S. Cl.
CPC ....... *H03M 13/353* (2013.01); *G06F 11/1068* (2013.01); *G11C 29/028* (2013.01);
(Continued)

(58) Field of Classification Search
CPC .......... H03M 13/6566; H03M 13/2906; G06F 3/0619; G06F 3/065; G06F 3/067;
(Continued)

(56) References Cited

U.S. PATENT DOCUMENTS 5,657,332 A * 8/1997 Auclair ................. G11C 16/10
                                                        365/184
7,823,043 B2 * 10/2010 Lasser .................... H03M 13/03
                                                        714/752
(Continued)

FOREIGN PATENT DOCUMENTS

EP          1990921 A3     5/2013

OTHER PUBLICATIONS

Haron et al., "Generalized Syndrome Weights," U.S. Appl. No. 15/223,302, filed Jul. 29, 2016, 44 pages.
(Continued)

*Primary Examiner* — Guerrier Merant
(74) *Attorney, Agent, or Firm* — Michael Best & Friedrich LLP (57) ABSTRACT

A device includes a memory, an error correction code (ECC) decoder, and an ECC input adjuster. The ECC decoder is configured to perform a first decode operation to decode a first portion of a representation of data read from the memory based on one or more decode parameters and to perform a second decode operation to decode a second portion of the representation of data based on one or more adjusted decode parameters. The ECC input adjuster is configured to adjust one or more decode parameters to set the one or more adjusted decode parameters based on a count of bits of the first portion that are erroneous.

19 Claims, 4 Drawing Sheets

(51) Int. Cl.
*G06F 11/10* (2006.01)
*G11C 29/52* (2006.01)
*H03M 13/29* (2006.01)
*G11C 29/02* (2006.01)
*G11C 29/42* (2006.01)
*G11C 29/04* (2006.01)

(52) U.S. Cl.
CPC .............. *G11C 29/42* (2013.01); *G11C 29/52* (2013.01); *H03M 13/2927* (2013.01); *G11C 2029/0411* (2013.01)

(58) Field of Classification Search
CPC ............. G06F 11/1068; G06F 11/1072; G06F 11/076; G06F 2212/403; G11C 29/52; G11C 11/5642; G11C 2211/5621; G11C 2029/0411; G11C 11/5685; G11C 29/028; G11C 29/021
See application file for complete search history.

(56) References Cited

U.S. PATENT DOCUMENTS

| | | | |
|---|---|---|---|
| 7,904,793 B2 | 3/2011 | Mokhlesi et al. | |
| 8,301,979 B2 | 10/2012 | Sharon et al. | |
| 8,418,026 B2* | 4/2013 | D'Abreu | G06F 11/1012 714/752 |
| 8,694,854 B1* | 4/2014 | Dar | G11C 11/5642 714/752 |
| 8,797,668 B1* | 8/2014 | Grinchuk | H03M 13/1102 360/46 |
| 9,128,858 B1* | 9/2015 | Micheloni | G06F 11/10 |
| 9,252,817 B2 | 2/2016 | Pan et al. | |
| 2006/0075320 A1* | 4/2006 | Gendrier | H03M 13/09 714/763 |
| 2009/0199073 A1* | 8/2009 | Kanaoka | G11B 20/1833 714/758 |
| 2010/0088575 A1 | 4/2010 | Sharon et al. | |
| 2013/0305114 A1* | 11/2013 | Olcay | H03M 13/1108 714/755 |
| 2015/0149840 A1* | 5/2015 | Alhussien | H03M 13/1125 714/719 |
| 2015/0205664 A1 | 7/2015 | Janik et al. | |
| 2015/0234706 A1* | 8/2015 | Alrod | G06F 11/1072 714/704 |
| 2016/0092284 A1* | 3/2016 | Shur | G06F 11/076 714/704 |
| 2016/0142074 A1 | 5/2016 | Sham et al. | |
| 2016/0191078 A1* | 6/2016 | Gilbert | H03M 13/1128 714/776 |
| 2017/0300377 A1* | 10/2017 | Kaynak | G06F 11/1068 |
| 2018/0032396 A1 | 2/2018 | Sharon et al. | |

OTHER PUBLICATIONS

United States Patent Office Action for U.S. Appl. No. 15/371,167 dated Mar. 28, 2018 (16 pages).
United States Patent Office Action for U.S. Appl. No. 15/896,440 dated Apr. 20, 2018 (5 pages).

* cited by examiner

FIG. 1

Adjust One or More Decode Parameters Based on Bit Counts After Decoding First Portion

Adjust One or More Decode Parameters Based on Bit Counts After Decoding Second Portion Adjust One or More Decode Parameters Based on Bit Counts of a First Codeword to Decode a Second Codeword

ECC ADJUSTMENT BASED ON DYNAMIC ERROR INFORMATION

CROSS REFERENCE TO RELATED APPLICATIONS

This application claims priority from and is a continuation-in-part application of U.S. patent application Ser. No. 15/371,167, filed on Dec. 6, 2016, the content of which is incorporated by reference herein in its entirety.

FIELD OF THE DISCLOSURE

The present disclosure is related to error correction code (ECC) input data.

BACKGROUND

Non-volatile data storage devices, such as embedded flash memory, have allowed for increased portability of data and software applications. Information that is read from a non-volatile data storage device is often processed by an error correction code (ECC) decoder to correct errors that may be introduced into stored data during operation of the non-volatile data storage device. One example of such an ECC decoder is a low-density parity check (LDPC) decoder.

An LDPC decoder may use soft bits (e.g., reliability information) to decode hard bits (e.g., information indicating voltages read from a memory). Utilization of reliability information (soft bits) may significantly improve the decoder's correction capability. A soft bit can indicate a reliability of a corresponding hard bit. For example, a value of a soft bit may indicate a low reliability value if a corresponding voltage read from a storage element is close to a transition region between two adjacent states. If many of the errors in stored values are concentrated in state overlap regions (e.g., regions between two adjacent states), soft bits can provide significant improvements in error correction capability.

However, the achievable correction capability of the decoder also depends on the "quality" of the reliability information. For example, if errors are not concentrated in state overlap regions, the reliability information provided by soft bits may not be accurate. Inaccurate soft bits can be generated when single-level cell (SLC) data having errors is "folded" in tri-level cells (TLCs) using a "blind" On-Chip-Copy (OCC) operation. As used herein, storage elements of a memory may be referred to as cells or memory cells. Inaccurate soft bits may also be generated when a TLC has a long error tail, such as a long Er-to-A tail (e.g., a stretching of a threshold voltage distribution of erased cells into the "A" programming state) caused by a program disturb. In these cases, a hard bit may be in error even though the corresponding soft bit indicates a high reliability value. Inaccuracies in soft bits may therefore reduce performance of an ECC decoder.

DETAILED DESCRIPTION

Particular implementations are described with reference to the drawings. In the description, common features are designated by common reference numbers throughout the drawings. As used herein, an ordinal term (e.g., "first," "second," "third," etc.) used to modify an element, such as a structure, a component, an operation, etc., does not by itself indicate any priority or order of the element with respect to another element, but rather merely distinguishes the element from another element having a same name (but for use of the ordinal term).

Error correction code (ECC) decoders using soft bits may be impacted by inaccuracies in the soft bits. For example, inaccurate soft bits can be generated when single-level cell (SLC) data having errors is "folded" in tri-level cells (TLCs) using a "blind" On-Chip-Copy (OCC) operation. Inaccurate soft bits may also be generated when a TLC has a long error tail, such as a long Er-to-A tail (e.g., a stretching of a threshold voltage distribution of erased cells into the "A" programming state) caused by a program disturb. In these cases, a hard bit may be in error even though the corresponding soft bit indicates a high reliability value. Such an error is referred to as a "Hard Error" (HE). Additionally, the hard bit may be correct even though the corresponding soft bit indicates a low reliability value. Such a bit is referred to as an "Unreliable Correct" (URC) bit.

In order for an ECC decoder to provide improved correction capability potential, the ECC decoder may be aware of the "quality" of the reliability information. To illustrate, the ECC decoder may adjust decoding based on a memory error model that dictates an expected number of erroneous bits and correct bits per each "reliability bin" (determined by the read hard bits and soft bits). For example, the memory error model may determine an expected number of errors, an expected number of HEs, an expected number of URC bits, and other errors and bit counts. Based on the memory error model, the ECC decoder may assign correct initial reliabilities to bits of read data. However, if the ECC decoder determines expected numbers of errors and bits based on a wrong underlying memory error model, the correction capability of the ECC decoder is degraded. To illustrate, a log likelihood ratio (LLR) table used by a low-density parity check (LDPC) decoder to decode the hard bits and the soft bits may be static and determined based on an underlying assumption about an expected number of HEs and URC bits. For example, the LLR table is often determined based on a Gaussian cell distribution (CVD) model that assumes an estimated number of HEs and URC bits and that errors are most likely to occur in particular voltage ranges (e.g., in transition overlap regions). If there is a large mismatch between the estimated number of HEs and URC bits and the actual number (e.g., measured or counted number) of HEs and URC bits, the soft bits may not improve, or may even degrade, the decoding capability of the LDPC decoder.

The present disclosure describes systems, devices, and methods for adjusting a decode parameter used to decode a portion of a representation of data based on bit counts, such as error counts and counts of particular bits, associated with at least one already decoded portion of the representation of data. The decode parameters may be adjusted to improve decode operations performed on subsequent portions of the representation of data. Dynamically adjusting decode parameters based on actual error counts (e.g., measured or counted error counts) associated with decoded portions of a representation of data may improve performance of decode operations on other portions of the representation of data as compared to adjusting decode parameters based on estimated error counts.

To illustrate, a representation of data may be read from a memory (e.g., a non-volatile memory of a data storage device) in response to a request for the data. The representation of data may include or correspond to a representation of an ECC codeword. As described further herein, some ECC codewords may be encoded as multiple separately decodable portions or multiple portions of the ECC codewords may be separately decoded during performance of decode operations. Because the multiple portions represent data that is stored in close proximity at the memory (e.g., at a particular word line, at adjacent storage elements, in a particular block, etc.) and because the data is retrieved together (e.g., during a read operation), errors associated with a first portion of the representation of data may be similar to (or the same as) errors associated with a second portion of the representation of data. Accordingly, adjusting one or more decode parameters based on (e.g., to compensate for) detected errors associated with the first portion may improve performance of a decode operation performed on the second portion or other subsequent portions. In some implementations, portions of a representation of data are physically interleaved such that different portions of the representation of data are likely to share the same error profile (e.g., a "Total Error" (TE) count, a "Hard Error" (HE) count, and an Unreliable Correct (URC) bit count, as described herein).

The one or more decode parameters may be adjusted based on bit counts. The bit counts may include error counts and counts of particular bits. The bit counts may be determined during a performance of decode operation(s) on one or more portions of the representation of data. For example, an ECC decoder may perform a decode operation on a first portion of the representation of data. During the performance of the decode operation, the ECC decoder may determine error count(s) and count(s) of particular bits. For example, the ECC decoder may determine a TE count representative of a total number of errors in the first portion, a HE count representative of a number of bits in the first portion that are erroneous and that are indicated as reliable, and a URC bit count representative of a number of bits in the first portion that are correct and that are indicated as being unreliable. The reliability (or unreliability) of the bits may be indicated by corresponding soft bits or other reliability information.

One or more decode parameters may be adjusted based on the bit counts. Adjustable decode parameters may include log likelihood ratio (LLR) values, estimated decode times, other parameters, or a combination thereof. The data storage device may adjust one or more decode parameters, such as LLR values, based on the bit counts. For example, the data storage device may calculate adjusted LLR values based on the TE count, the HE count, and the URC bit count, as further described herein. Additionally or alternatively, the data storage device may retrieve from a memory a set of LLR values that correspond to the TE count, the HE count, the URC bit count, or a combination thereof. The adjusted LLR values may be provided to the ECC decoder as adjusted ECC input (e.g., adjusted decode parameters).

Based on adjusted ECC input data associated with a first portion of the representation of data, the ECC decoder may decode a second portion of the representation of data. The process may continue until an entirety of the representation of data (e.g., the entire ECC codeword) is decoded. For example, after each portion of the representation of data is decoded, the one or more decode parameters may be adjusted based on bit counts associated with the most recently decoded portion, bit counts associated with multiple decoded portions, one or more values (e.g., averages) based on the bit counts, or a combination thereof. Because errors may be similar for each portion of an ECC codeword (e.g., a representation of data), adjusting the one or more decode parameter values based on already decoded portions may provide benefits when performing decode operations on other portions of the ECC codeword. The improved performance of later decode operations of codewords may improve throughput of the ECC decoder and reduce power consumption associated with decode operations.

Figure 1:
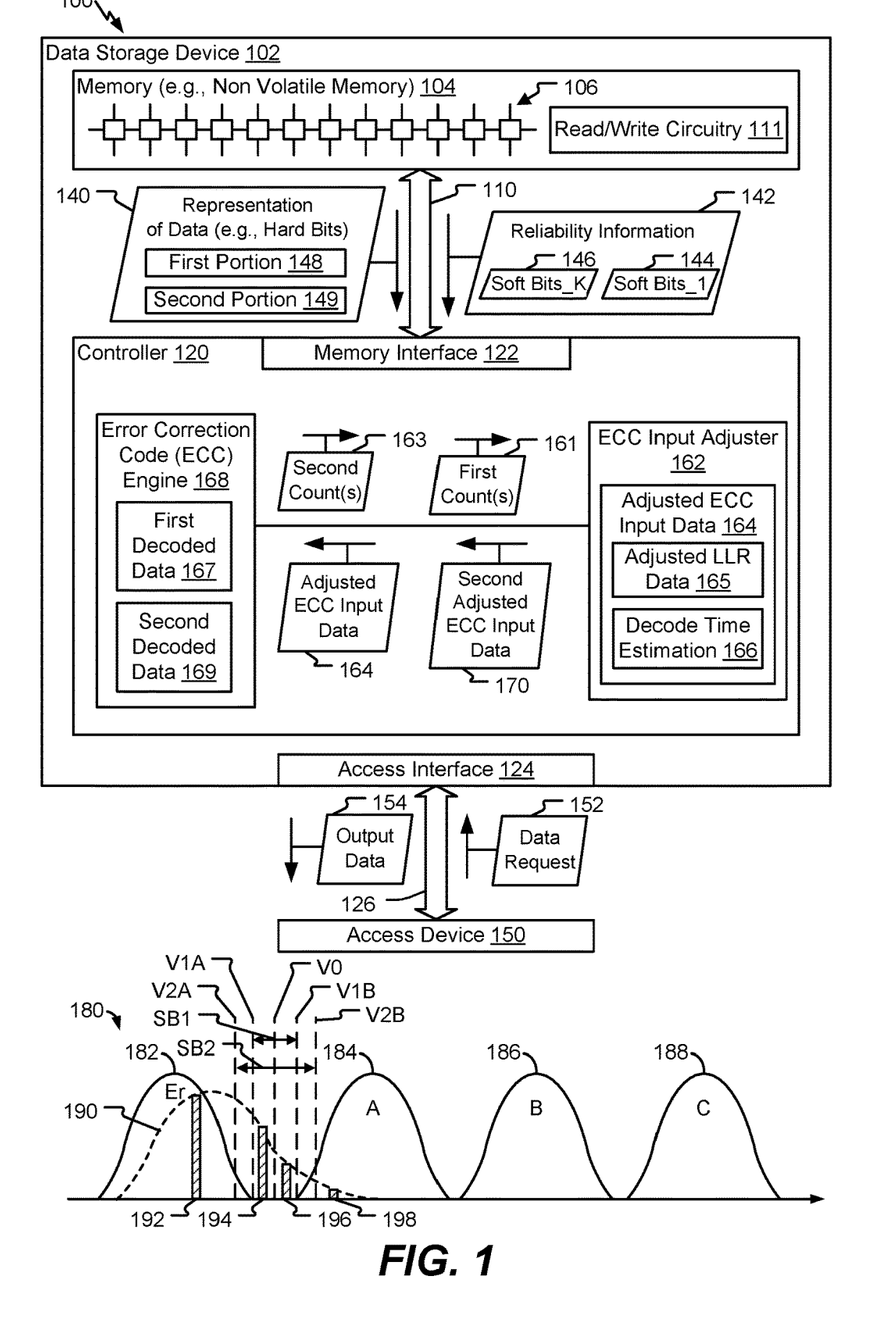
FIG. 1 is a block diagram of an illustrative example of a system including a device configured to adjust one or more decode parameters based on error count(s) associated with decoded portions of a representation of data.

FIG. 1 illustrates a system 100 that includes an access device 150 and a data storage device 102. The access device 150 is coupled to the data storage device 102 via a communication path 126. The communication path 126 may be a bus or a wireless connection, as non-limiting examples. The data storage device 102 may include an access interface 124 that enables communication via the communication path 126, such as when the access interface 124 is communicatively coupled to the access device 150.

The access device 150 may include a memory interface (not shown) and may be configured to communicate with the data storage device 102 via the memory interface to read data from and write data to one or more memories of the data storage device 102. For example, the access device 150 may operate in compliance with a Joint Electron Devices Engineering Council (JEDEC) industry specification, such as a Universal Flash Storage (UFS) Access Controller Interface specification. As other examples, the access device 150 may operate in compliance with one or more other specifications, such as a Secure Digital (SD) Access Controller specification, as an illustrative, non-limiting example. The access device 150 may communicate with the one or more memories in accordance with any other suitable communication protocol.

The access device 150 may include a processor and a memory. The memory may be configured to store data and/or instructions that are executable by the processor. The memory may be a single memory or may include multiple memories, such as one or more non-volatile memories, one or more volatile memories, or a combination thereof. The access device 150 may issue one or more commands to the data storage device 102, such as one or more requests to erase data, read data from, or write data to the data storage device 102. For example, the access device 150 may be configured to provide data to be stored at the data storage device 102 or to request data to be read from the data storage device 102. The access device 150 may include a mobile telephone, a music player, a video player, a gaming console, an electronic book reader, a personal digital assistant (PDA), a computer, such as a laptop computer or notebook computer, a network computer, a server, any other electronic device, or any combination thereof, as illustrative, non-limiting examples.

The data storage device 102 includes a memory 104 and a controller 120. In some implementations, the data storage device 102 may include a memory device that includes one or more memory dies (e.g., one memory die, two memory dies, eight memory dies, or another number of memory dies). The memory 104 may be a non-volatile memory that includes one or more storage elements 106. For example, the memory 104 may include a flash memory (e.g., a NAND flash memory, a NOR flash memory, etc.) or a resistive random access memory (ReRAM), as illustrative, non-limiting examples. In some implementations, the memory 104 may include or correspond to a memory die of the data storage device 102. The memory 104 may have a three-dimensional (3D) memory configuration. As an example, the memory 104 may have a 3D vertical bit line (VBL) configuration. In a particular implementation, the memory 104 is a non-volatile memory having a 3D memory configuration that is monolithically formed in one or more physical levels of arrays of memory cells having an active area disposed above a silicon substrate. Alternatively, the memory 104 may have another configuration, such as a two-dimensional (2D) memory configuration or a non-monolithic 3D memory configuration (e.g., a stacked die 3D memory configuration).

The memory 104 may store data in multiple regions that include one or more storage elements 106 (e.g., memory cells). The one or more storage elements 106 may be configured to store data. For example, each storage element of the one or more storage elements 106 may be programmable to a state (e.g., a threshold voltage in a flash configuration or a resistive state in a resistive memory configuration) that indicates one or more values. Each block of the memory 104 may include one or more word lines. Each word line may include one or more pages, such as one or more physical pages. In some implementations, each page may be configured to store a codeword. A word line may be configurable to operate as a single-level cell (SLC) word line, a multi-level cell (MLC) word line, or as a tri-level cell (TLC) word line, as non-limiting examples. SLC data may be stored as a single bit per storage element, and MLC data may be stored as multiple bits per storage element.

The memory 104 may include support circuitry, such as read/write circuitry 111, to support operation of one or more memory dies of the memory 104. For example, the read/write circuitry 111 may include one or more buffers, drivers, or other circuitry used to perform read operations, write operations, or both, at the memory 104. The read/write circuitry 111 may be a single component or may be divided into separate components of the memory 104, such as read circuitry and write circuitry. The read/write circuitry 111 may be external to the one or more dies of the memory 104. Alternatively, one or more individual memory dies of the memory 104 may include corresponding read/write circuitry 111 that is operable to read data from and/or write data to storage elements within the individual memory die independent of any other read and/or write operations at any of the other memory dies. In some implementations, the read/write circuitry 111 is configured to perform read operations based on adjusted read parameters, as further described herein.

The controller 120 is coupled to the memory 104 via a bus 110, an interface (e.g., interface circuitry, such as a memory interface 122), another structure, or a combination thereof. For example, the bus 110 may include one or more channels to enable the controller 120 to communicate with a single memory die of the memory 104. As another example, the bus 110 may include multiple distinct channels to enable the controller 120 to communicate with each memory die of the memory 104 in parallel with, and independently of, communication with other memory dies of the memory 104. The controller 120 is configured to receive data and instructions from the access device 150 and to send data to the access device 150. For example, the controller 120 may send data to the access device 150 via the access interface 124, and the controller 120 may receive data from the access device 150 via the access interface 124. The controller 120 is configured to send data and commands to the memory 104 and to receive data from the memory 104. For example, the controller 120 is configured to send data and a write command to cause the memory 104 to store data to a specified address of the memory 104. The write command may specify a physical address of a portion of the memory 104 (e.g., a physical address of a word line of the memory 104) that is to store the data. The controller 120 is also configured to send a read command to the memory 104 to cause read data to be sent from the memory 104 to the controller 120. The read command may specify a physical address of a portion of the memory 104 (e.g., a physical address of a word line of the memory 104). The read data may include a representation of data stored at the memory 104 and reliability information, as further described herein. The controller 120 may also be configured to send data and commands to the memory 104 associated with background scanning operations, garbage collection operations, wear leveling operations, relocation operations, etc., as illustrative, non-limiting examples.

The controller 120 includes an error correction code (ECC) input adjuster 162 coupled to an ECC engine 168. The ECC input adjuster 162 may be configured to receive the read data from the memory 104, to determine one or more bit counts (e.g., error counts and counts of particular bits) associated with portions of the read data as they are decoded, and to modify a decode parameter based on the one or more bit counts. The decode parameter may include log likelihood ratio (LLR) data, estimated decode times, or other decode parameters that may be modified during decoding of portions of a representation of data (e.g., during a "current" read operation). In some implementations, the decode parameter may include soft bit values, read threshold values, or soft bit delta values that may be modified prior to performing additional read operations or performing a second read operation on a representation of data after a first decoding operation has failed.

Modifying a decode parameter based on the one or more bit counts may also be referred to herein as adjusting ECC input data based on the one or more bit counts (e.g., error counts and counts of particular bits) to generate adjusted ECC input data 164, as further described herein. The adjusted ECC input data 164 may be provided to the ECC engine 168 to improve performance of the ECC engine 168. Although the ECC input adjuster 162 and the ECC engine 168 are described as separate components, in other implementations, a single component (e.g., an ECC engine) may perform the operations of both the ECC input adjuster 162 and the ECC engine. Although illustrated as being included in the controller 120, in other implementations, the ECC input adjuster 162, the ECC engine 168, or both, may be separate from the controller 120.

The ECC engine 168 is configured to receive data to be stored at the memory 104 and to generate a codeword. For example, the ECC engine 168 may include an encoder configured to encode data using an ECC scheme, such as a Reed-Solomon encoder, a Bose-Chaudhuri-Hocquenghem (BCH) encoder, a low-density parity check (LDPC) encoder, a Turbo Code encoder, an encoder configured to encode one or more other ECC encoding schemes, or a combination thereof, as illustrative, non-limiting examples. In a particular implementation, the ECC engine 168 includes an LDPC encoder. The codeword may be sent (e.g., transmitted) from the controller 120 to the memory 104 and stored at the one or more storage elements 106.

The ECC engine 168 may also be configured to receive data and to process the received data in accordance with one or more ECC decoding schemes. For example, the ECC engine 168 may include one or more decoders, such as an LDPC decoder, configured to decode the received data to detect and correct, up to an error correction capability of the ECC scheme, any bit errors that may be present in the data. To illustrate, the representation of data read from the memory may include a representation of codeword, and the decoder may be configured to decode the codeword in accordance with an ECC scheme to generate decoded data (e.g., output data). As another example, the representation of data may include a representation of a portion of a codeword that is independently decodable, and the decoder may be configured to decode the portion of the codeword in accordance with an ECC scheme to generate decoded data (e.g., output data or data used to generate output data). The decoded data may be provided to the access device 150, for example in response to a read command from the access device 150.

The ECC input adjuster 162 may receive a representation of data 140 and reliability information 142 from the memory 104. For example, the controller 120 may issue a read command to the memory 104, and the controller 120 may receive a representation of data 140 (e.g., hard bits) stored at an address indicated by the read command and reliability information 142 associated with the representation of data 140. The representation of data 140 may include one or more bits that are determined based on threshold voltages of the one or more storage elements 106, in a particular implementation. The one or more bits are referred to as hard bits. The representation of data 140 may include multiple independently decodable portions, such as an illustrative first portion 148 and an illustrative second portion 149. Additionally or alternatively, the representation of data 140 may be decoded by performance of separate decode operations on multiple portions of the representation of data. As used herein, portions of a representation of data refer to portions that are encoded during performance of encode operations or portions that are used during performance of separate decode operations. Although two portions are illustrated in FIG. 1, the representation of data 140 may include more than two portions.

In a particular implementation, the representation of data 140 may include an LDPC codeword that includes multiple independently decodable sub-codes, and the first portion 148 and the second portion 149 may each include a sub-code. To illustrate, an LDPC encoder may encode information in such a way that multiple sub-codes are generated. Each sub-code is able to be decoded (e.g., without information from any other sub-code). Additionally, decoded information from each of the sub-codes may be used to maintain the correction capability of the codeword as a whole. For example, at least some parity data from the multiple sub-codes may be used as received parity that is compared to parity generated based on the entire codeword as part of a decode operation. Because the portions 148-149 of a codeword (e.g., each of the multiple sub-codes) are stored in approximately the same physical location in the memory 104, similar errors may be likely to exist in the multiple sub-codes. Additionally or alternatively, the portions 148-149 may be physically interleaved such that the portions 148-149 are likely to share the same error profile. Thus, performing a decode operation on a sub-code based on one or more decode parameters determined based on bit counts associated with a previously decoded sub-code may improve speed or reduce power consumption of the ECC engine 168 during performance of the decode operation.

In another particular implementation, the representation of data 140 may include a convolutional low-density parity check (CLDPC) codeword that is decodable using multiple "windows". The first portion 148 may correspond to a first window, and the second portion 149 may correspond to a second window. To illustrate, the ECC engine 168 may be configured to perform a windowed decode process that includes performing a decode operation on a portion of the representation of data 140 based on a corresponding window (e.g., a subset of rows and columns) of a parity check matrix (or another matrix based on the parity check matrix) that is used by the ECC engine 168 to perform CLDPC encoding. For example, the ECC engine 168 may perform a first decode operation on the first portion 148 based on a first window (e.g., a first subset of rows and columns of the parity check matrix) having a first size, and the ECC engine 168 may perform a second decode operation the second portion 149 based on a second window (e.g., a second subset of rows and columns of the parity check matrix) having a second size. In a particular implementation, the first size corresponds to a size of the first portion 148, the second size corresponds to a size of the second portion 149, and the first size is greater than the second size. The ECC engine 168 may be configured to adjust (e.g., move or "slide") the windows during the decode operations. Decoded data associated with each decode operation may be converged to generate output data (e.g., a decoding of the codeword). In a particular implementation, each decode operation may be performed by a different ECC decoder within the ECC engine 168.

The reliability information 142 may include one or more soft bits. Each soft bit may correspond to a hard bit and may indicate a reliability of the corresponding hard bit. For example, a first value of a soft bit (e.g., a logical "1" value) may indicate that the corresponding hard bit has a low reliability level (e.g., that the corresponding hard bit is indicated as unreliable), and a second value of the soft bit (e.g., a logical "0" value) may indicate that the corresponding hard bit has a high reliability level (e.g., that the corresponding hard bit is indicated as reliable). In a particular implementation, the reliability information 142 includes multiple sets of soft bits, including first soft bits 144 (Soft Bits_1) and Kth soft bits 146 (Soft Bits_K). K is a number that is greater than or equal to two. Each set of soft bits may be determined by reading the one or more storage elements 106 using different soft bit delta values. As described further herein, a soft bit delta value indicates a difference between a read threshold (e.g., a first read voltage associated with determining the hard bits) and a second read voltage associated with determining the soft bits.

Histogram 180 in FIG. 1 may correspond to threshold voltages that can be programmed at the memory 104. In the histogram 180, each abscissa indicates threshold voltages of storage elements of the memory 104, and each ordinate indicates a number of storage elements of the memory 104 having a particular threshold voltage. The storage elements may correspond to the one or more storage elements 106.

The histogram 180 includes an erase state distribution 182, an "A" state distribution 184, a "B" state distribution 186, and a "C" state distribution 188. The erase state distribution 182, the "A" state distribution 184, the "B" state distribution 186, and the "C" state distribution 188 may be associated with a particular lower page (LP) bit value and a particular upper page (UP) bit value. For example, the erase state distribution 182 may correspond to a "11" state, the "A" state distribution 184 may correspond to a "01" state, the "B" state distribution 186 may correspond to a "00" state, and the "C" state distribution 188 may correspond to a "10" state. The threshold voltages can be sensed by applying one or more read thresholds (e.g., read voltages) to storage elements of the memory 104, such as by applying a read threshold V0.

Additionally, soft bits may be sensed by applying one or more other read voltages that differ from the read threshold V0. The soft bit read voltages may be selected to correspond to state overlap regions (e.g., regions where one state distribution may overlap another state distribution). For example, the first soft bits 144 may be sensed by application of read voltages and may indicate storage elements having threshold voltages within a range SB1 between V1A and V1B, and the Kth soft bits 146 may be sensed by application of read voltages and may indicate storage elements having threshold voltages within a range SB2 between V2A and V2B, as non-limiting examples. A soft bit delta value corresponds to the difference between an upper (or lower) read voltage for soft bit values and the read threshold. For example, the soft bit delta value SBΔ1, corresponding to the range SB1, is equal to V1B-V0 (or V0-V1A). Thus, the range SB1 is defined as the range from read threshold −SBΔ1 to read threshold +SBΔ1. As another example, the soft bit delta value SBΔ2, corresponding to the range SB2, is equal to V2B-V0 (or V0-V2A).

The ECC engine 168 may be configured to process portions of a codeword (e.g., the representation of data 140) read from the memory 104 and to determine one or more bit counts (e.g., error counts and counts of particular bits) based on the portion. To illustrate, the ECC engine 168 may decode a portion of a representation of data based on the hard bits corresponding to the portion and reliability information corresponding to the hard bits. During performance of a decode operation on the portion, the ECC engine 168 may determine one or more bit counts based on the portion. For example, the ECC engine 168 may be configured to determine a "Total Error" (TE) count representative of a total number of bits of the portion that are estimated to be erroneous, a "Hard Error" (HE) count representative of a number of bits of the portion that are estimated to be erroneous and are and that are indicated as reliable, and an "Unreliable Correct" (URC) bit count representative of a number of bits of the portion that are estimated to be correct and that are indicated as unreliable.

The HE count may track the number of hard bits that are erroneous and are associated with one or more soft bits having a particular value (or a threshold number of soft bits having the particular value) that indicates that the hard bits are reliable, and the URC bit count may track the number of hard bits that are correct and are associated with one or more soft bits having a second particular value (or a threshold number of soft bits having the second particular value) that indicates that the hard bits are unreliable. In some implementations, the ECC engine 168 may also be configured to determine an "Unreliable Error" (URE) count representative of a number of bits of the portion that are incorrect and are indicated as unreliable, and a "Reliable Correct" (RC) bit count representative of a number of bits of the portion that are correct and are indicated as reliable.

To illustrate various bit counts, reference is made to the histogram 180. The histogram 180 also illustrates an erase state distribution 190 that is associated with a higher number of errors than the erase state distribution 182. For example, threshold voltage distribution of erased cells (e.g., storage elements) in the erase state distribution 190 may "stretch" into the A state distribution 184. Cells having threshold voltages located within a first region 192 of the erase state distribution 190 may store correct data and may be indicated as reliable (e.g., bits stored in these cells may be represented by the RC bit count). Cells having threshold voltages located within a second region 194 of the erase state distribution 190 may be correct and may be indicated as unreliable (e.g., bits stored in these cells may be represented in the URC bit count). Cells having threshold voltages located within a third region 196 of the erase state distribution 190 may be erroneous and may be indicated as unreliable (e.g., bits stored in these cells may be represented in the TE count and the URE count). Cells having threshold voltages located within a fourth region 198 of the erase state distribution 190 may be erroneous and may be indicated as reliable (e.g., bits stored in these cells may be represented in the TE count and the HE count).

The ECC engine 168 may be configured to determine one or more of the above-described bit counts during performance of a decode operation on a portion of a representation of data. For example, the ECC engine 168 may be configured to determine first bit counts 161 (e.g., a TE count, an HE count, and a URC count) as part of a decode operation performed on the first portion 148 of the representation of data 140. The ECC engine 168 may be configured to send the first bit counts 161 to the ECC input adjuster 162. For example, the ECC engine 168 may generate a message or data packet that includes or indicates the first bit counts 161, and the ECC engine 168 may send the message (or data packet) to the ECC input adjuster 162.

The ECC input adjuster 162 may be configured to modify one or more decode parameters based on bit counts (e.g., error counts and counts of particular bits) to generate one or more adjusted decode parameters. The one or more decode parameters may be represented by ECC input data. Adjusting the one or more decode parameters may cause adjustment of ECC input data (e.g., generation of adjusted ECC input data) based on the one or more bit counts. The one or more decode parameters (represented by the ECC input data) may include probability values, such as LLR values. LLR values may indicate an estimated value and a likelihood of the estimated value. For example, a sign of an LLR value may indicate a bit estimation (e.g., a positive LLR value corresponds to an estimated value of 0 and a negative LLR value corresponds to an estimated value of 1), and a magnitude of the LLR value may indicate a reliability of the estimation (e.g., a larger magnitude is associated with a higher reliability). The ECC engine 168 may be configured to decode representations of the data, or portions thereof, using LLR data that corresponds to the representations of the data (e.g., using an LDPC decoder). Additionally or alternatively, the one or more decode parameters may include an estimated decoding time. The estimated decoding time may be used by the ECC engine 168, or other components of the data storage device 102, for scheduling or other purposes.

The ECC input adjuster 162 may be configured to adjust the ECC input data (e.g., data indicative of the one or more decode parameters), such as default LLR data, based on the one or more bit counts. For example, the ECC input adjuster 162 may determine LLR data that corresponds to the one or more bit counts, and the determined LLR data may be provided to the ECC engine 168 instead of default LLR data. Default LLR data may include LLR data that is indicative of a default LLR table. The default LLR data is generated based on one or more underlying assumptions about the nature and amount of errors that occur in the memory 104. For example, the default LLR data may be generated based on a Gaussian cell voltage distribution (CVD) model that assumes that most errors occur in state overlap regions. However, such a model may not accurately reflect the actual errors that occur in read data that is read from the memory 104. If the actual error characteristics (e.g., the error counts and the bit counts) differ from the underlying assumption (e.g., the Gaussian CVD model), performance of the ECC engine 168 may be degraded by the use of reliability information, such as soft bits or default LLR data.

To improve operation of the ECC engine 168, the ECC input adjuster 162 may be configured to determine LLR data that more accurately reflects estimated errors, and the ECC input adjuster 162 may be configured to replace the default LLR data with the determined LLR data to generate adjusted ECC input data. To illustrate, the ECC input adjuster 162 may store, or have access to, multiple sets of LLR data. Each set of LLR data may be indicative of a corresponding LLR table. For example, first LLR data may be indicative of a first LLR table. Each set of LLR data (e.g., each LLR table) may be predetermined and stored in a memory of the ECC input adjuster 162 or the controller 120. Each set of LLR data (e.g., each LLR table) is generated based on an underlying model (such as a Gaussian CVD model or other model) that is associated with a TE count, a HE count, and a URC bit count (or ranges of the TE count, the HE count, and the URC bit count). The ECC input adjuster 162 may be configured to access a set of LLR data based on the corresponding error counts. For example, each set of LLR data may be indexed by a combination of TE count, HE count, and URC bit, or mappings of LLR data to combinations of TE count, HE count, and URC bit count may be contained in a look-up table, as non-limiting examples. In some implementations, the LLR data may also be indexed or correspond to URE counts and RC bit counts.

The ECC input adjuster 162 may be configured to select a set of LLR data to be provided as adjusted ECC input data based on the TE count, the HE count, and the URC count determined by the ECC engine 168. For example, the ECC input adjuster 162 may receive the TE count, the HE count, and the URC bit count from the ECC engine 168, and the ECC input adjuster 162 may select LLR data that corresponds to error counts that match the TE count, the HE count, and the URC bit count (or a subset thereof). For example, the ECC input adjuster 162 may select first LLR data in response to determining that the TE count, the HE count, and the URC bit count match (or most closely match, or are within the ranges of) bit counts associated with the first LLR data.

Adjusted LLR data 165 (e.g., the selected LLR data) may be provided to the ECC engine 168 as the adjusted ECC input data 164. For example, data indicative of the selected LLR table (e.g., the adjusted LLR data 165) may be provided to the ECC engine 168 instead of data indicative of a default LLR table. Because the adjusted ECC input data 164 is indicative of LLR values (e.g., decode parameters) that are adjusted based on one or more decoded portions of the representation of data 140, the adjusted ECC input data 164 may more accurately represent errors that are detected during performance of decode operations on subsequent portions of the representation of data 140. Additionally or alternatively, the adjusted ECC input data 164 may include a decode time estimation 166. The decode time estimation 166 may be dynamically updated based on the bit counts to more accurately estimate the decoding time, as compared to determining a single decode time estimate for decoding the entire representation of data 140.

Additionally or alternatively, the ECC input adjuster 162 may be configured to compute the adjusted LLR data 165 based on the TE count, the HE count, and the URC count. For example, ECC input adjuster 162 may compute the LLR data according to the following:

$$LLR_j = \begin{cases} \log\dfrac{N-URC-TE}{HE} & \text{if } HB_j = 0 \ \& \ SB_j = 1 \\ \log\dfrac{URC}{TE-HE} & \text{if } HB_j = 0 \ \& \ SB_j = 0 \\ -\log\dfrac{N-URC-TE}{HE} & \text{if } HB_j = 1 \ \& \ SB_j = 0 \\ -\log\dfrac{URC}{TE-HE} & \text{if } HB_j = 1 \ \& \ SB_j = 1 \end{cases} \quad \text{(Equation 1)}$$

In Equation 1, $LLR_j$ is the jth adjusted LLR value, $HB_j$ is the jth hard bit, $SB_j$ is the jth soft bit, N is the total number of bits (e.g., in a decoded portion of the representation of data 140), TE is the total error count, HE is the hard error count, and URC is the unreliable correct bit count.

In a particular implementation, the TE count, the HE count, and the URC bit count are counts that are determined based on a decode operation performed on a previous portion of the representation of data 140. In another particular implementation, the TE count, the HE count, and the URC bit count are based on bit counts corresponding to multiple decoded portions of the representation of data 140. For example, the TE count, the HE count, and the URC bit count may include or correspond to the average number of errors, the average number of hard errors, and the average number of URC bits, respectively, for multiple decoded portions (e.g., all decoded portions or a particular number of most recently decoded portions) of the representation of data 140. In other implementations, the TE count, the HE count, and the URC bit count may include or correspond to median values, mode values, or other values based on multiple decoded portions of the representation of data 140.

The ECC engine 168 may be configured to use the adjusted ECC input data 164 (e.g., the adjusted LLR data 165) and the reliability information 142 to perform decode operations on subsequent portions of the representation of data 140. For example, the ECC engine 168 may be configured to perform a decode operation on the second portion 149 based on the adjusted ECC input data 164. Because the error profile (e.g., the TE count, the HE count, and the URC bit count, as a non-limiting example) of the second portion 149 is likely to be similar to the error profile of the first portion 148, performing a decode on the second portion 149 based on the adjusted ECC input data 164 (e.g., data indicative of adjusted decode parameters) may improve performance of the ECC engine 168 (e.g., increase throughput and/or reduce power consumption) as compared to performing a decode operation on the second portion 149 based on static LLR data or default LLR data or LLR data based on estimated bit counts.

Although described above as including LLR data and estimated decode times, in a particular implementation, the one or more decode parameters may include one or more soft bits. The ECC input adjuster 162 may be configured to adjust soft bits (e.g., of the reliability information 142) based on the bit counts (e.g., error counts and counts of particular bits). For example, a voltage region that was previously indicated as reliable (e.g., based on one or more soft bits associated with decoded portions of the representation of data 140) may be determined to be unreliable responsive to detected errors associated with the voltage region. For example, if the HE count (or another error count) for bits associated with the voltage region exceeds a threshold, the voltage region may be determined to be unreliable. Soft bits associated with subsequent portions of the representation of data 140 may be adjusted to indicate that bits corresponding to the voltage region are unreliable (or less reliable). Additionally, soft bits associated with bits that correspond to a second voltage region may be modified to indicate that the bits are reliable (or more reliable) responsive to a determination that the HE count (or another error count) for the bits fails to exceed a second threshold.

In another particular implementation, one or more read parameters may be adjusted based on the bit counts (e.g., error counts and counts of particular bits). The read parameters may include read thresholds, soft bit delta values, other read parameters, or a combination thereof. To illustrate, the controller 120 may determine that a first bit value (e.g., a one value) is associated with more errors than a second bit value (e.g., a zero value) in the representation of data 140 (e.g., in one or more portions or on average for the representation of data 140), and the controller 120 may modify a read threshold to be closer to the voltage distribution of the state corresponding to the first value. As another example, the controller 120 may determine that the HE count exceeds a threshold, and the controller 120 may increase a soft bit delta value to reduce a number of hard errors in a next codeword read from the memory 104. In other implementations, the bit counts (or values derived from the bit counts) may be used as indices to retrieve adjusted read parameter values from a table or other data structure stored at a memory of the controller 120. The controller 120 may be configured to provide the adjusted read parameter values to the memory 104 for use in a subsequent read operation (e.g., by the read/write circuitry 111) associated with a physical location in the memory 104 that is proximate or nearby the physical location of the storage elements associated with the representation of data 140.

In a particular implementation, an ECC decoder (e.g., a decoder included in the ECC engine 168) of a data storage device (e.g., the data storage device 102) is configured to perform a first decode operation to decode a first portion (e.g., the first portion 148) of a representation of data (e.g., the representation of data 140) read from a memory (e.g., the memory 104) based on one or more decode parameters and to perform a second decode operation to decode a second portion (e.g., the second portion 149) based on one or more adjusted decode parameters (e.g., the adjusted ECC input data 164). The one or more decode parameters may include one or more LLR values. An ECC input adjuster (e.g., the ECC input adjuster 162) of the data storage device is configured to adjust the one or more decode parameters to set the one or more adjusted decode parameters (e.g., the adjusted ECC input data 164) based on a count of bits (e.g., the first bit count 161) of the first portion that are erroneous. The count of bits may include at least one of a first count of bits that are erroneous (e.g., a TE count) and a second count of bits that are erroneous and that are indicated as reliable (e.g., a HE count). As an illustrative example, the one or more decode parameters may be adjusted based on the first count of bits and based on the second count of bits. The one or more adjusted decode parameters may be further adjusted based on a third count of bits that are correct and that are indicated as unreliable (e.g., a URC bit count).

In a particular implementation, the ECC decoder is configured to determine the count of bits. The ECC decoder may also be configured to determine a second count of bits (e.g., second bit count 163) that represent at least bits of the second portion of the representation of data that are erroneous. For example, the second bit count 163 may include a second TE count, a second HE count, and a second URC bit count associated with the second portion 149. The ECC input adjuster 162 may be configured to further adjust the one or more adjusted decode parameters (e.g., the adjusted ECC input data 164) based on the second count of bits (e.g., the second bit count 163) to set the one or more adjusted decode parameters to new values (e.g., to generate second adjusted ECC input data 170). The ECC decoder may be configured to decode a third portion of the representation of data based on the one or more adjusted decode parameters (e.g., the second adjusted ECC input data 170). Additionally or alternatively, the ECC decoder may be configured to determine particular values, such as average values, based on the adjusted ECC input data 164 and the second adjusted ECC input data 170, and to decode the third portion based on the particular values.

During operation, the access device 150 may issue a data request 152 to the data storage device 102. The data request 152 may specify an address at the memory 104, such as a logical address of the one or more storage elements 106. The controller 120 may receive the data request 152 and may issue a read command to the memory 104. The read command may specify a physical address that corresponds to the logical address of the data request 152. In response to issuing the read command, the controller 120 may receive the representation of data 140 and the reliability information 142 from the memory 104. The representation of data 140 may include (or be decodable using) multiple separately decodable portions, such as the first portion 148 and the second portion 149. For example, the first portion 148 and the second portion 149 may include or correspond to subcodes. As another example, the first portion 148 and the second portion 149 may include or correspond to windows used by the ECC engine 168 to decode a CLDCP codeword (e.g., the representation of data 140).

The ECC engine 168 may perform a first decode operation on the first portion 148 of the representation of data 140 to generate first decoded data 167. During performance of the first decode operation, the ECC engine 168 may determine the first bit counts 161 (e.g., a TE count, an HE count, and a URC bit count, as a non-limiting example). The ECC engine 168 may provide the first bit counts 161 to the ECC input adjuster 162.

The ECC input adjuster 162 may adjust ECC input data (e.g., one or more decode parameters) based on the first bit counts 161. For example, the ECC input adjuster 162 may determine the adjusted LLR data 165 based on the first bit counts 161. As a particular example, the ECC input adjuster 162 may retrieve the adjusted LLR data 165 using one or more of the first bit counts 161 as index values. As another particular example, the ECC input adjuster 162 may calculate the adjusted LLR data 165 based on the first bit counts 161, in accordance with Equation 1. Additionally or alternatively, the ECC input adjuster 162 may determine the decode time estimation 166 based on the first bit counts 161. The adjusted ECC input data 164 may include or indicate the adjusted LLR data 165, the decode time estimation 166, or both.

The ECC engine 168 may receive the adjusted ECC input data 164 and may perform a second decode operation on the second portion 149 of the representation of data 140 based on the adjusted ECC input data 164 to generate second decoded data 169. For example, the ECC engine 168 may perform the second decode operation using the adjusted LLR data 165 in accordance with an LDPC scheme. During performance of the second decode operation, the ECC engine 168 may determine the second bit counts 163 (e.g., a second TE count, a second HE count, and a second URC bit count, as a non-limiting example). The ECC engine 168 may provide the second bit counts 163 to the ECC input adjuster 162. The ECC input adjuster 162 may determine the second adjusted ECC input data 170 (e.g., data indicative of further adjustment of the decode parameters) based on the second bit counts 163.

In this manner, each portion of the representation of data 140 (e.g., the codeword) may be decoded based on decode parameters (e.g., ECC input data) that are adjusted based on bit counts associated with the previously decoded portion. In other implementations, a portion of the representation of data 140 may be decoded based on decode parameters associated with multiple previously decoded portions. For example, the ECC input adjuster 162 may adjust the decode parameters (e.g., adjust the ECC input data) based on average values of the bit counts for the multiple previously decoded portions, median values of the bit counts, mode values of the bit counts, or other values based on the error counts and bit counts associated with multiple decoded portions of the representation of data 140.

The ECC engine 168 may generate final decoded data (e.g., output data 154) based on the decoded data generated during the multiple decode operations. For example, the ECC engine 168 may concatenate, converge, or otherwise combine the first decoded data 167, the second decoded data 169, and any other decoded data associated with the representation of data 140 to generate the output data 154. The data storage device 102 may provide the output data 154 to the access device 150 (e.g., responsive to the data request 152).

In a particular implementation, the access device 150 may issue a second data request for data that is located at a location in the memory 104 that is proximate or nearby to the location of the decoded data. For example, the second data request may indicate an address or address range that corresponds to a physical location same block of the memory 104, on the same memory die, or associated with the same word line, as non-limiting examples. The controller 120 may retrieve a second representation of data from the memory 104, and the ECC engine 168 may decode the second representation of data (or a portion thereof) based on adjusted ECC input data generated after completion of a decode process for the representation of data 140. For example, the ECC engine 168 may apply the adjusted ECC input data as default ECC input data, and during performance of decode operation on a first portion of the second representation of data. The adjusted ECC input data may be further adjusted based on bit counts (e.g., error counts and counts of particular bits) associated with portions decoded portions of the second representation of data, as described above. Additionally or alternatively, a read operation to retrieve the second representation of data may be performed based on one or more adjusted read parameters determined based on the decode processes associated with the portions of the representation of data 140.

Thus, the data storage device 102 of FIG. 1 may improve performance of decode operations performed on ECC codewords (e.g., representations of data read from the memory 104) that can be decoded using multiple separately decodable portions (e.g., sub-codes or CLDPC windows). Because errors may be similar for each portion of the ECC codeword, adjusting one or more decode parameter values based on decoded portions of the codeword may provide benefits when decoding other portions of the ECC codeword. For example, adjusting the one or more decode parameters may improve throughput of the ECC engine 168 and reduce power consumption associated with decode operations.

Referring to FIGS. 2A-2D, examples of adjusting decode parameters based on bit counts associated with multiple decode operations are illustrated. The bit counts are associated with performance of decode operations on portions of a codeword 200 (e.g., a representation of data read from a memory, such as the memory 104 of FIG. 1). In FIGS. 2A-2D, the codeword 200 may be decoded as N portions. As a non-limiting example, N may be 12 (corresponding to the values depicted in FIGS. 2A-2D. In other examples, N may be less than 12 or greater than 12. Each portion may correspond to a sub-code or a window of a CLDPC codeword, as described with reference to FIG. 1. The bit counts include first bit counts generated based on the most recently decoded portion (in the columns labeled "Decoded Portion"), second bit counts generated based on multiple decoded portions (in the columns labeled "Total Counts"), and average values of bit counts generated based on the multiple decoded portions (in the columns labeled "Average"). The bit counts are also divided into total errors (labeled "TE"), hard errors (labeled "HE"), and unreliable correct (URC) bits (labeled "URC"). Each of FIGS. 2A-2D illustrate bits counts at various times, such as before performance of decode operations or after performance of decode operations on the codeword 200. The values depicted in FIGS. 2A-2D are illustrative and may be different values for different codewords.

Figure 2A:
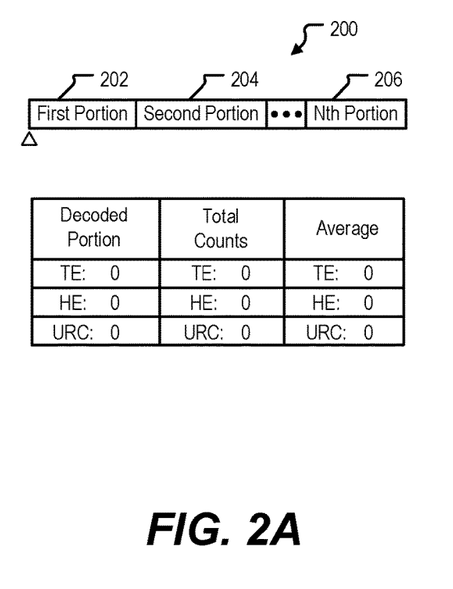
FIGS. 2A-D illustrate illustrative examples of adjusting decode parameters based on bit counts associated with multiple decode operations.

FIG. 2A illustrates the bit counts prior to performance of a decode operation on any portion of the codeword 200. At this time, all of the bit counts are zero. In other implementations, the bit counts may be set to default values prior to performing decode operations on the codeword 200. In other implementations, the bit counts may be set to values determined during performance of decode operations on another codeword, such as a codeword that is associated with a physical location in memory that is proximate or nearby a physical location associated with the codeword 200.

Figure 2B:
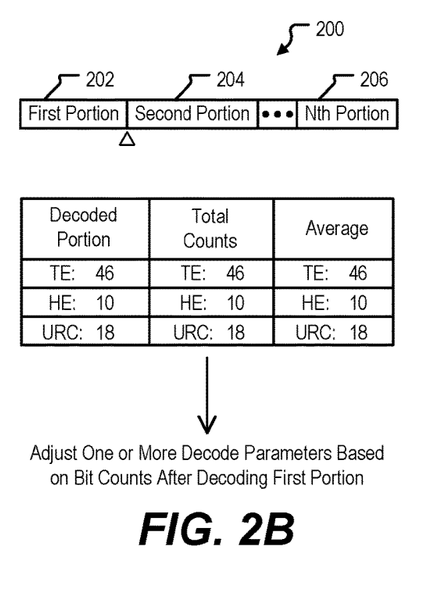

FIG. 2B illustrates the bit counts after performance of a decode operation on a first portion 202 of the codeword 200. The decode operation may be performed based on default decode parameters (or based on decode parameters that have been adjusted based on a different codeword). During performance of the decode operation on the first portion 202, an ECC decoder (e.g., the ECC engine 168 of FIG. 1) may detect 46 total errors, 10 hard errors, and 18 URC bits. Because only the first portion 202 has been decoded at this time, the total count values and the average values are the same as the decoded portion values. In other implementations, the average values may be calculated based on the decoded portion values and other values, such as default values or values associated with a different codeword. The decoded portion values or the average values may be used to adjust one or more decode parameters. For example, adjusted LLR data may be determined based on the decoded portion values or the average values, as described with reference to FIG. 1.

Figure 2C:
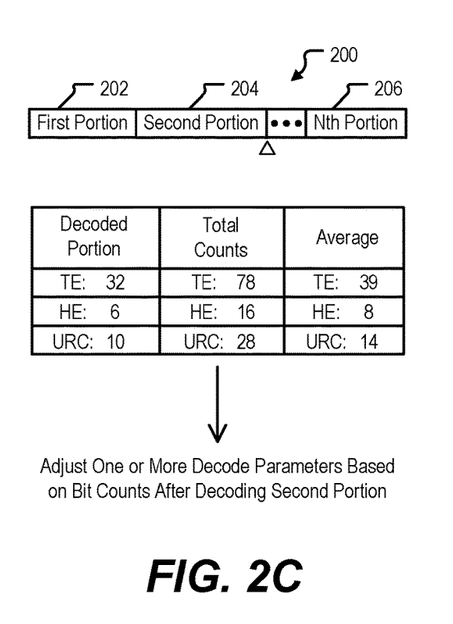

FIG. 2C illustrates the bit counts after performance of a decode operation on a second portion 204 of the codeword 200. The decode operation may be performed based on the adjusted decode parameters determined in FIG. 2B. During performance of the decode operation on the second portion 204, the ECC decoder may detect 32 total errors, 6 hard errors, and 10 URC bits. The total count values may be updated to 78 total errors, 16 hard errors, and 28 URC bits.

The average values may be updated to 39 total errors (e.g., (46+32)/2), 8 hard errors (e.g., (10+6)/2), and 14 URC bits (e.g., (18+10)/2). The decoded portion values or the average values may be used to further adjust one or more decode parameters. For example, second adjusted LLR data may be determined based on the decoded portion values or the average values.

Figure 2D:
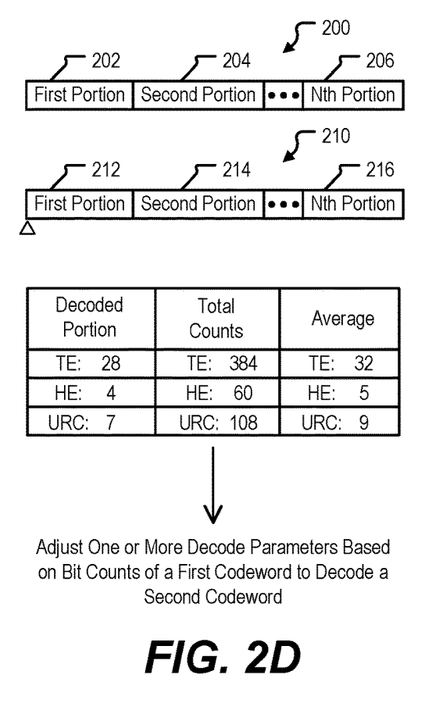

FIG. 2D illustrates the bit counts after performance of a decode operation on an Nth portion 206 (e.g., a last portion) of the codeword 200. The decode operation may be performed based on the second adjusted decode parameters determined in FIG. 2C. During performance of the decode operation on the Nth portion 206 (e.g., a 12th portion in this example), the ECC decoder may detect 28 total errors, 4 hard errors, and 7 URC bits. The total count values may be updated to 384 total errors, 60 hard errors, and 108 URC bits. The average values may be updated to 32 total errors (e.g., (46+32+ . . . +28)/12), 5 hard errors (e.g., (10+6+ . . . +4)/12), and 9 URC bits (e.g., (18+10+ . . . +7)/12). Alternatively, the average values may be based on a particular number of most recently decoded portions instead of based on all decoded portions of the codeword 200. The decoded portion values or the average values may be used to further adjust one or more decode parameters. For example, Nth adjusted LLR data may be determined based on the decoded portion values or the average values.

In a particular example, a physical location in a memory associated with a second codeword 210 may be proximate to or nearby a physical location of the codeword 200. Thus, the Nth adjusted LLR data associated with the codeword 200 may be used to perform a decode operation on a first portion 212 of the second codeword 210. Bit counts may be updated based on the decode operation and decode parameters may be adjusted based on the bit counts. A second portion 214 through an Nth portion 216 of the second codeword 210 may be decoded in a similar manner. Because decode parameters are updated based on bit counts determined during performance of a decode operation on a portion of a codeword, the adjusted decode parameters may improve a decode operation performed on a subsequent portion of the codeword.

Figure 3:
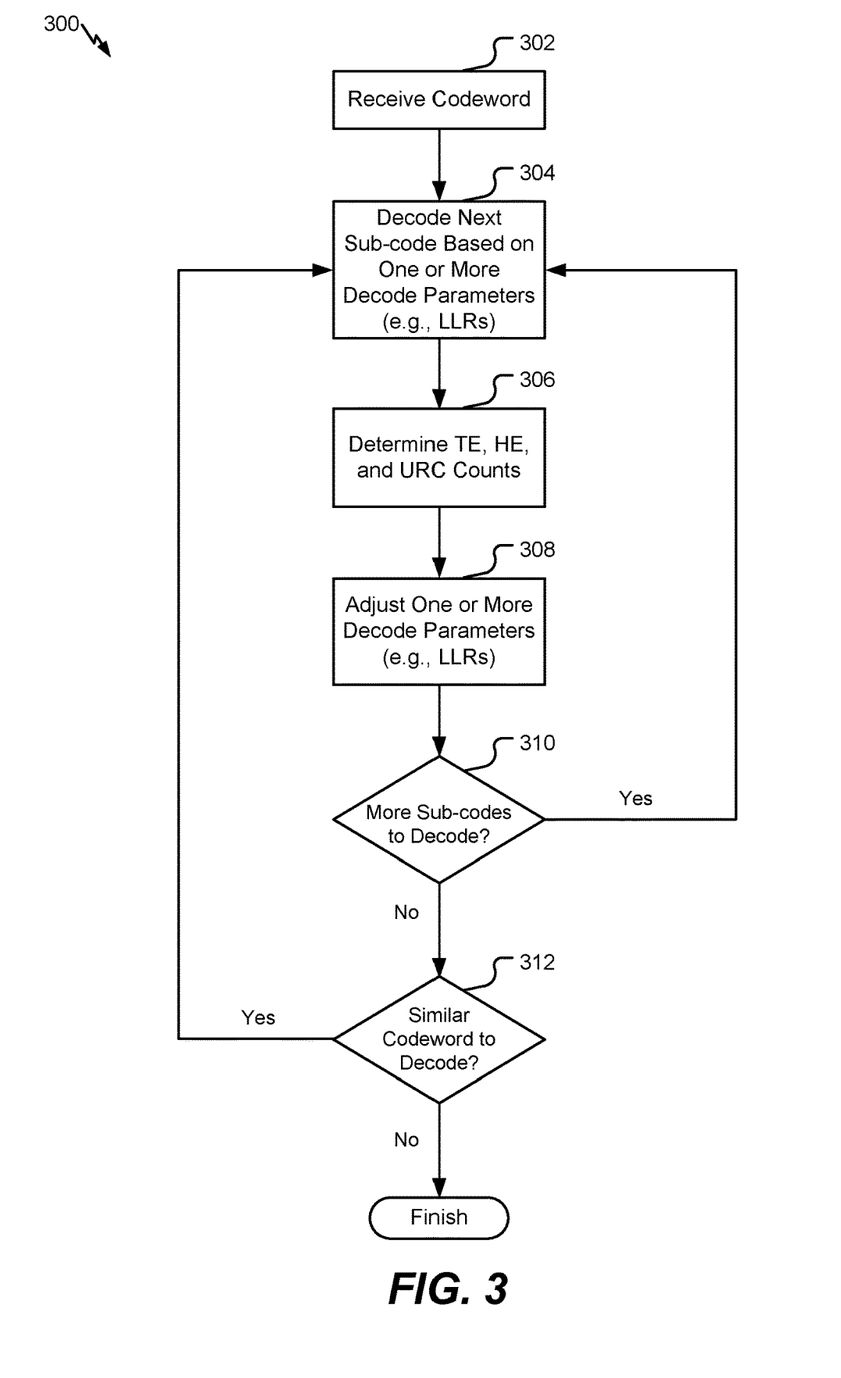
FIG. 3 is a flow diagram that illustrates an example of a method of dynamically adjusting decode parameter(s) based on bit counts.

Referring to FIG. 3, a particular illustrative example of a method 300 of dynamically adjusting decode parameter(s) based on bit counts is shown. The method 300 may be performed at a controller of a device, such as the controller 120 of the data storage device 102 of FIG. 1.

The method 300 includes receiving a codeword, at 302. For example, the codeword may include the representation of data 140 that is read from the memory 104 responsive to the data request 152 of FIG. 1. The method 300 includes decoding a next sub-code of the codeword based on one or more decode parameters, at 304. For example, the sub-code may include or correspond to the first portion 148 of the representation of data 140 of FIG. 1, and the one or more decode parameters may include LLR data, estimated decoding times, other decode parameters, or a combination thereof. Although referred to as a sub-code, in other implementations, the sub-code may instead be a different type of portion, such as a window used to decode a CLDPC codeword. If no other sub-code of the codeword has been decoded, a decode operation performed on the sub-code may be based on default decode parameters, such as default LLR data. If at least one sub-code of the codeword has been decoded, the decode operation may be performed based on adjusted decode parameters, such as decode parameters that have been adjusted based on bit counts associated with the at least one decoded sub-code.

The method 300 includes determining a TE count, an HE count, and a URC bit count based on the sub-code, at 306. For example, the TE count, the HE count, and the URC bit count may correspond to the first bit counts 161 of FIG. 1. To further illustrate, the TE count, the HE count, and the URC bit count may be determined by an ECC decoder (e.g., the ECC engine 168 of FIG. 1) during performance of a decode operation on the sub-code. Although described as determining a TE count, an HE count, and a URC bit count, in other implementations, less than three bit counts or additional bit counts (e.g., a RC bit count and an URE count) may be determined.

The method 300 includes adjusting one or more decode parameters based on the TE count, the HE count, and the URC count, at 308. For example, the adjusted one or more decode parameters may correspond to the adjusted ECC input data 164, which may include the adjusted LLR data 165 of FIG. 1. The adjusted LLR data may be calculated based on the bit counts (e.g., the TE count, the HE count, and the URC bit count) or may be accessed or retrieved from a memory based on the bit counts (e.g., using the bit counts as an index or using a mapping table).

The method 300 includes determining whether the codeword includes more sub-codes to decode, at 310. In response to determining that the codeword includes one or more additional sub-codes to decode, the method 300 proceeds to 304, where a decoding operation based on the adjusted decode parameters is performed on the next sub-code. For example, a decode operation based on the adjusted ECC input data 164 may be performed on the second portion 149 of the representation of data 140. In response to determining that the codeword does not include any more sub-codes to decode, the method 300 proceeds to 312.

The method 300 optionally includes determining whether a similar codeword is available to decode, at 312. For example, if another read request is received (or if the read request indicated an address range of data to be read), a physical location in the memory associated with the codeword may be compared to a physical location in the memory associated with a second codeword. If the physical locations are proximate or nearby, the second codeword is considered "similar". In response to determining that the second codeword is similar to the codeword, the method 300 proceeds to 304, where one or more decode operations are performed on the second codeword. In response to determining that no other received codeword is similar to the codeword (or in response to determining that no more sub-codes remain to decode for the codeword when step 312 is not present), the method 300 ends.

The method 300 may improve decoding of one or more codewords that include multiple sub-codes. To illustrate, because decode parameters are adjusted based on bit counts detected during decode operations performed on sub-codes of the codeword, the decode parameters may more accurately reflect the errors in the codeword than static decode parameters (e.g., default decode parameters). Performing decode operations on remaining sub-codes of the codeword based on more accurate decode parameters may improve speed and reduce power consumption of the decode operations.

Figure 4:
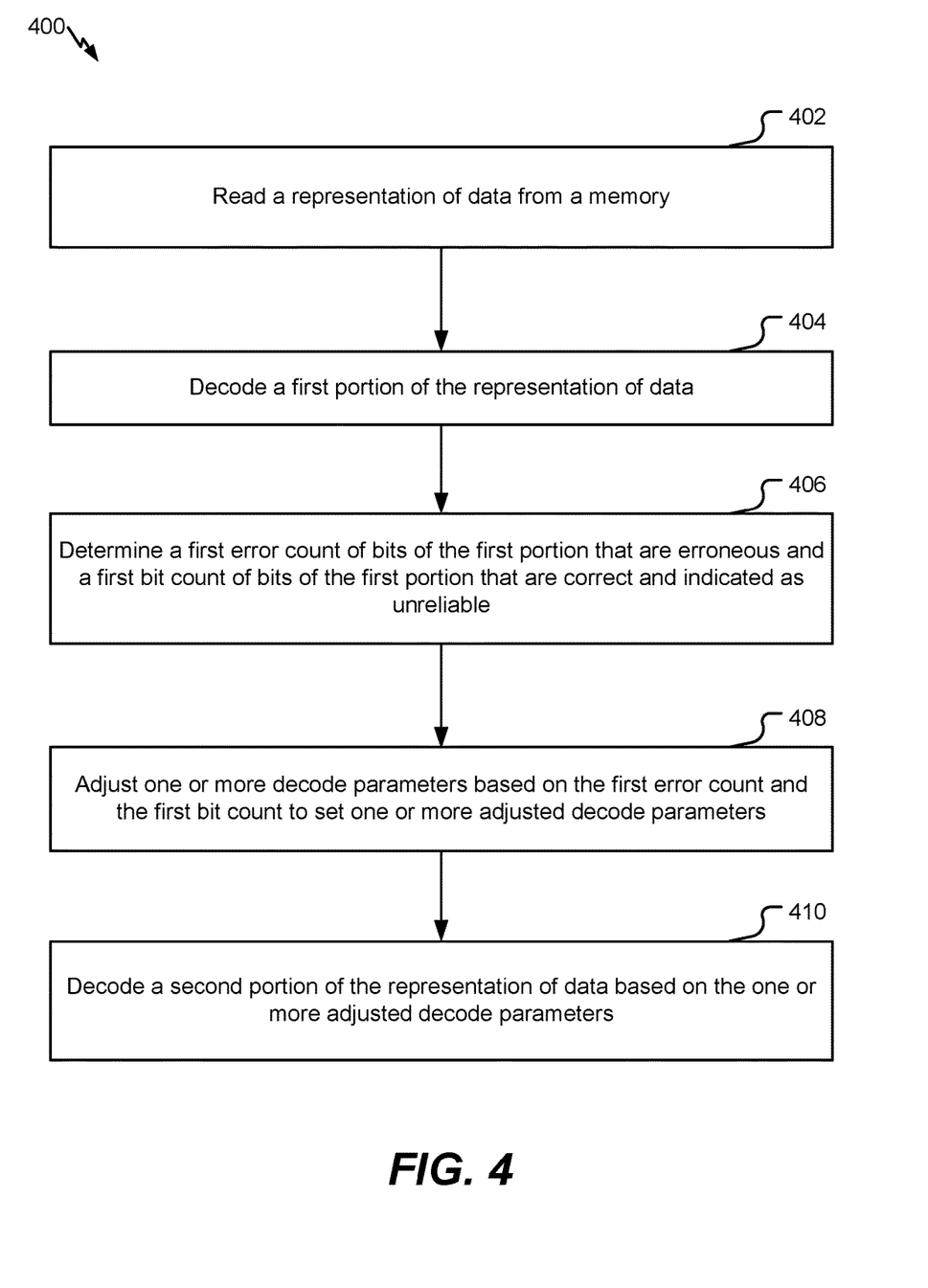
FIG. 4 is a flow diagram that illustrates an example of a method of adjusting a decode parameter based on bit counts associated with at least one decoded portion of a representation of data.

Referring to FIG. 4, a particular illustrative example of a method 400 of adjusting a decode parameter based on bit counts associated with at least one decoded portion of a representation of data is shown. The method 400 may be performed at a controller of a device, such as the controller 120 of the data storage device 102 of FIG. 1.

The method 400 includes reading a representation of data from a memory, at 402. For example, the representation of data may include or correspond to the representation of data 140, the memory may include or correspond to the memory 104, and the request for data may include or correspond to the data request 152 of FIG. 1. In a particular implementation, the representation of data includes a low-density parity check (LDPC) codeword that includes multiple sub-codes. The multiple sub-codes may be independently decodable. In another particular implementation, the representation of data includes a CLDPC codeword. The first portion may correspond to a first window associated with the CLDPC codeword, and the second portion may correspond to a second window associated with the CLDPC codeword.

The method 400 includes decoding a first portion of the representation of data, at 404. For example, the first portion may include or correspond to the first portion 148 of the representation of data 140 of FIG. 1. The method 400 includes determining a first error count of bits of the first portion that are erroneous and a first bit count of bits of the first portion that are correct and indicated as unreliable, at 406. For example, the first error count may include or correspond to a TE count or an HE count represented by the first bit counts 161 of FIG. 1, and the first bit count may include or correspond to a URC bit count represented by the first bit counts 161. In other implementations, additional bit counts (e.g., URE counts and RC bit counts) may be determined.

The method 400 includes adjusting one or more decode parameters based on the first error count and the first bit count to set one or more adjusted decode parameters, at 408. For example, the one or more adjusted decode parameters may include or correspond to the adjusted ECC input data 164 of FIG. 1. The one or more decode parameters may include an expected decoding time to decode the representation of data, one or more LLR values, or both.

The method 400 further includes decoding a second portion of the representation of data based on the one or more adjusted decode parameters, at 410. For example, the second portion may include or correspond to the second portion 149 of the representation of data 140 of FIG. 1, which is decoded based on the adjusted ECC input data 164.

In a particular implementation, the method 400 includes performing a second adjustment on the one or more adjusted decode parameters based on a second error count of bits of the second portion that are erroneous and a second bit count of bits of the second portion that are correct and indicated as unreliable. For example, the second error count may include or correspond to at least one of a TE count and an HE count represented by the second bit counts 163 of FIG. 1, the second bit count may include or correspond to a URC bit count represented by the second bit counts 163, and the second adjustment performed on the one or more decode parameters may result in the second adjusted ECC input data 170. The method 400 further includes decoding a third portion of the representation of data based on the adjusted one or more decode parameters. For example, with reference to FIG. 1, a third portion of the representation of data 140 may be decoded based on the second adjusted ECC input data 170.

In some implementations, the method 400 includes performing a second adjustment on the one or more adjusted decode parameters based on a first value (representing an average of the first error count and a second error count of bits of the second portion that are erroneous) and a second value (an average of the first bit count and a second bit count of bits of the second portion that are correct and indicated as unreliable). The method 400 may further include decoding a third portion of the representation of data based on the adjusted one or more decode parameters. Additionally or alternatively, the method 400 may include, after decoding the third portion of the representation of data, reading a representation of second data from the memory responsive to receiving a second request for the second data. The method 400 may further include decoding a fourth portion of the representation of second data based on the adjusted one or more decode parameters. For example, a portion of a second representation of data may be decoded based on one or more decode parameters (e.g., ECC input data) that is adjusted based on decode operations performed on the portions of the representation of data 140. In a particular implementation, the second representation of data is decoded based on the adjusted decode parameters because the data and the second data are stored in the same block of the memory.

The method 400 may improve may improve decoding of a representation of data that can be decoded separately in multiple portions. To illustrate, because decode parameters are adjusted based bit counts detected during decode operations performed on portions of the representation of data, the decode parameters may more accurately reflect the errors in the representation of data than static decode parameters (e.g., default decode parameters). Performing decode operations on the remaining portions of the representation of data based on more accurate decode parameters may improve speed and reduce power consumption of the decode operations.

The method 300 of FIG. 3, the method 400 of FIG. 4, or a combination thereof, may be initiated or controlled by an application-specific integrated circuit (ASIC), a processing unit, such as a central processing unit (CPU), a controller, another hardware device, a firmware device, a field-programmable gate array (FPGA) device, or any combination thereof. As an example, the method 300 of FIG. 3, the method 400 of FIG. 4, or a combination thereof, can be initiated or controlled by one or more processors, such as one or more processors included in or coupled to a controller or a memory of the data storage device 102 and/or the access device 150 of FIG. 1. As an example, the method 300 of FIG. 3, the method 400 of FIG. 4, or a combination thereof, individually or in combination, may be performed by the controller 120 of FIG. 1. To illustrate, a portion of the method 300 of FIG. 3 or a portion of the method 400 of FIG. 4 may be combined with other operations described herein. Additionally, one or more operations described with reference to FIGS. 3-4 may be optional, may be performed at least partially concurrently, and/or may be performed in a different order than shown or described.

In an illustrative example, a processor may be programmed to adjust one or more decode parameters based on bit counts associated with decode portions of a representation of data. For example, the processor may execute instructions to read a representation of data from a memory responsive to receiving a request for the data. The processor may execute instructions to decode a first portion of the representation of data and to determine a first error count of bits of the first portion that are erroneous (e.g., a TE count, an HE count, or both) and a first bit count of bits of the first portion that are correct and indicated as unreliable (e.g., a URC bit count). The processor may execute instructions to adjust one or more decode parameters (e.g., LLR data, estimated decode times, etc.) based on the first error count and the first bit count to set one or more adjusted decode parameters. The processor may further execute instructions to decode a second portion of the representation of data based on the one or more adjusted decode parameters.

Although various components of the data storage device 102 and/or the access device 150 of FIG. 1 are depicted herein as block components and described in general terms, such components may include one or more microprocessors, state machines, or other circuits configured to enable the various components to perform operations described herein. For example, the ECC input adjuster 162 may represent physical components, such as hardware controllers, state machines, logic circuits, or other structures, to enable the controller 120 to encode and decode data.

It should be appreciated that one or more aspects of the various components may be implemented using a microprocessor or microcontroller programmed to perform operations described herein, such as one or more operations of the method 300 of FIG. 3 or the method 400 of FIG. 4. In a particular implementation, each of the controller 120, the memory 104, and/or the access device 150 of FIG. 1 includes a processor executing instructions that are stored at a memory, such as a non-volatile memory of the data storage device 102 or the access device 150 of FIG. 1. Alternatively or additionally, executable instructions that are executed by the processor may be stored at a separate memory location that is not part of the non-volatile memory, such as at a read-only memory (ROM) of the data storage device 102 or the access device 150 of FIG. 1.

In a particular implementation, an apparatus includes means for storing data. For example, the means for storing may include the memory 104 of FIG. 1, one or more other devices, circuits, modules, or instructions to store data, or a combination thereof.

The apparatus includes means for reading a representation of data from the means for storing. For example, the means for reading may include the memory interface 122 of FIG. 1, the controller 120 of FIG. 1, one or more other devices, circuits, modules, or instructions to read a representation of data, or a combination thereof.

The apparatus includes means for adjusting first log likelihood ratio (LLR) values based on at least a count of bits of a first portion of the representation of data that are erroneous to set second LLR values. For example, the means for adjusting may include the ECC input adjuster 162 of FIG. 1, the controller 120 of FIG. 1, one or more other devices, circuits, modules, or instructions to adjust LLR values based on counts of bits, or a combination thereof. In some implementations, the means for adjusting is configured to adjust the first LLR values based on a first count of bits of the first portion that are erroneous (e.g., a TE count), a second count of bits of the first portion that are erroneous and are indicated as reliable (e.g., an HE count), and a third count of bits of the first portion that are correct and that are indicated as unreliable (e.g., a URC bit count).

The apparatus further includes means for decoding the first portion based on the first LLR values and for decoding a second portion of the representation of data based on the second LLR values. For example, the means for decoding may include the ECC engine 168 of FIG. 1, the controller 120 of FIG. 1, one or more other devices, circuits, modules, or instructions to decode portions of representations of data based on LLR values, or a combination thereof. In some implementations, the second LLR values are set based on stored LLR values that correspond to the count of bits.

In a particular implementation, the apparatus further includes means for receiving a request for the data from an access device. For example, the means for receiving may include the access interface 124, the controller 120, one or more other devices, circuits, modules, or instructions to receive a request for data from an access device, or any combination thereof. In some implementations, the representation of data is read from the means for storing responsive to the request.

With reference to FIG. 1, in some implementations, the data storage device 102 may be embedded within the access device 150, such as in accordance with a Joint Electron Devices Engineering Council (JEDEC) Solid State Technology Association Universal Flash Storage (UFS) configuration. Alternatively, the data storage device 102 may be removable from the access device 150 (i.e., "removably" coupled to the access device 150). As an example, the data storage device 102 may be removably coupled to the access device 150 in accordance with a removable universal serial bus (USB) configuration. In some implementations, the data storage device 102 may include or correspond to a solid state drive (SSD) which may be included in, or distinct from (and accessible to), the access device 150. For example, the data storage device 102 may include or correspond to an SSD, which may be used as an embedded storage drive (e.g., a mobile embedded storage drive), an enterprise storage drive (ESD), a client storage device, or a cloud storage drive, as illustrative, non-limiting examples. In some implementations, the data storage device 102 may be coupled to the access device 150 indirectly, e.g., via a network. For example, the network may include a data center storage system network, an enterprise storage system network, a storage area network, a cloud storage network, a local area network (LAN), a wide area network (WAN), the Internet, and/or another network. In some implementations, the data storage device 102 may be a network-attached storage (NAS) device or a component (e.g., a solid-state drive (SSD)) device) of a data center storage system, an enterprise storage system, or a storage area network.

In some implementations, the data storage device 102 may be configured to be coupled to the access device 150 as embedded memory, such as eMMC® (trademark of JEDEC Solid State Technology Association, Arlington, Va.) and eSD, as illustrative examples. To illustrate, the data storage device 102 may correspond to an eMMC (embedded MultiMedia Card) device. As another example, the data storage device 102 may correspond to a memory card, such as a Secure Digital (SD®) card, a microSD® card, a miniSD™ card (trademarks of SD-3C LLC, Wilmington, Del.), a MultiMediaCard™ (MMC™) card (trademark of JEDEC Solid State Technology Association, Arlington, Va.), or a CompactFlash® (CF) card (trademark of SanDisk Corporation, Milpitas, Calif.). Alternatively, the data storage device 102 may be removable from the access device 150 (e.g., "removably" coupled to the access device 150). As an example, the data storage device 102 may be removably coupled to the access device 150 in accordance with a removable universal serial bus (USB) configuration.

The data storage device 102 may operate in compliance with an industry specification. For example, the data storage device 102 may include a SSD and may be configured to communicate with the access device 150 using a small computer system interface (SCSI)-type protocol, such as a serial attached SCSI (SAS) protocol. As other examples, the data storage device 102 may be configured to communicate with the access device 150 using a NVM Express (NVMe) protocol or a serial advanced technology attachment (SATA) protocol. In other examples, the data storage device 102 may operate in compliance with a JEDEC eMMC specification, a JEDEC universal flash storage (UFS) specification, one or more other specifications, or a combination thereof, and may be configured to communicate using one or more protocols, such as an eMMC protocol, a UFS protocol, a USB protocol, and/or another protocol, as non-limiting examples.

In some implementations, the data storage device 102 and the access device 150 may be configured to communicate using one or more protocols, such as a SAS protocol, a SATA protocol, an NVMe protocol, an eMMC protocol, a UFS protocol, a USB protocol, and/or another protocol, as illustrative, non-limiting examples. The one or more protocols may include a standardized protocol and/or a non-standardized protocol, such as a proprietary protocol. As other examples, the access device 150 may operate in compliance with a JEDEC industry specification, such as a UFS Access Controller Interface specification. In some implementations, the data storage device 102 and the access device 150 may be configured to communicate using dual channel communication (e.g., both devices may issue and receive commands from the other device).

Semiconductor memory devices include volatile memory devices, such as dynamic random access memory ("DRAM") or static random access memory ("SRAM") devices, non-volatile memory devices, such as magnetoresistive random access memory ("MRAM"), resistive random access memory ("ReRAM"), electrically erasable programmable read only memory ("EEPROM"), flash memory (which can also be considered a subset of EEPROM), ferroelectric random access memory ("FRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure. In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements is formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where they direction is substantially perpendicular and the x and z directions are substantially parallel to the major surface of the substrate). As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in they direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of a non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor material such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Alternatively, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically used for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this disclosure is not limited to the two dimensional and three dimensional illustrative structures described but cover all relevant memory structures within the scope of the disclosure as described herein and as understood by one of skill in the art. The illustrations of the embodiments described herein are intended to provide a general understanding of the various embodiments. Other embodiments may be utilized and derived from the disclosure, such that structural and logical substitutions and changes may be made without departing from the scope of the disclosure. This disclosure is intended to cover any and all subsequent adaptations or variations of various embodiments. Those of skill in the art will recognize that such modifications are within the scope of the present disclosure.

The above-disclosed subject matter is to be considered illustrative, and not restrictive, and the appended claims are intended to cover all such modifications, enhancements, and other embodiments, that fall within the scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. A device comprising:
    a memory;
    an error correction code (ECC) decoder configured to perform a first decode operation to decode a first portion of a representation of data read from the memory based on one or more decode parameters and to perform a second decode operation to decode a second portion of the representation of data based on one or more adjusted decode parameters; and
    an ECC input adjuster configured to adjust the one or more decode parameters to set the one or more adjusted decode parameters based on a count of bits of the first portion that are erroneous,
        wherein the count of bits includes at least one of a first count of bits that are erroneous and a second count of bits that are erroneous and that are indicated as reliable.

2. The device of claim 1, wherein the one or more decode parameters comprises one or more log likelihood ratio (LLR) values.

3. The device of claim 1, wherein the one or more decode parameters are adjusted further based on a third count of bits that are correct and that are indicated as unreliable.

4. The device of claim 1, wherein the ECC decoder is further configured to determine the count of bits.

5. The device of claim 4, wherein the ECC decoder is further configured to determine the second count of bits, the second count of bits representing at least bits of the second portion that are erroneous.

6. The device of claim 5, wherein the ECC input adjuster is further configured to further adjust the one or more adjusted decode parameters based on the second count of bits, and wherein the ECC decoder is further configured to decode a third portion of the representation of data based on the one or more adjusted decode parameters.

7. A method performed by a controller of a data storage device, the method comprising:
    reading a representation of data from a memory;
    decoding a first portion of the representation of data;
    determining a first error count of bits of the first portion that are erroneous and a first bit count of bits of the first portion that are correct and indicated as unreliable;
    adjusting one or more decode parameters based on the first error count and the firstbit count to set one or more adjusted decode parameters; and
    decoding a second portion of the representation of data based on the one or more adjusted decode parameters.

8. The method of claim 7, further comprising:
    performing a second adjustment on the one or more adjusted decode parameters based on a second error count of bits of the second portion that are erroneous and a second bit count of bits of the second portion that are correct and indicated as unreliable; and
    decoding a third portion of the representation of data based on the adjusted one or more decode parameters.

9. The method of claim 8, further comprising:
    after decoding the third portion of the representation of data, reading a representation of second data from the memory responsive to receiving a second request for the second data; and
    decoding a fourth portion of the representation of second data based on the adjusted one or more decode parameters.

10. The method of claim 9, wherein the data and the second data are stored in the same block of the memory.

11. The method of claim 7, further comprising:
    performing a second adjustment on the one or more adjusted decode parameters based on a first value and a second value, the first value representing an average of the first error count and a second error count of bits of the second portion that are erroneous, the second value representing an average of the first bit count and a second bit count of bits of the second portion that are correct and indicated as unreliable; and
    decoding a third portion of the representation of data based on the adjusted one or more decode parameters.

12. The method of claim 7, wherein the one or more decode parameters includes an expected decoding time to decode the representation of data.

13. The method of claim 7, wherein the one or more decode parameters comprises one or more log likelihood ratio (LLR) values.

14. The method of claim 7, wherein the representation of data includes a lowdensity parity check (LDPC) codeword that includes multiple sub-codes, and wherein the multiple sub-codes are independently decodable.

15. The method of claim 7, wherein the representation of data includes a convolutional low-density parity check (CLDPC) codeword, wherein the first portion corresponds to a first window associated with the CLDPC codeword, and wherein the second portion corresponds to a second window associated with the CLDPC codeword.

16. A data storage device comprising:
means for storing data;
means for reading a representation of data from the means for storing;
means for adjusting first log likelihood ratio (LLR) values based on at least a count of bits of a first portion of the representation of data that are erroneous to set second LLR values; and
means for decoding the first portion based on the first LLR values and for decoding a second portion of the representation of data based on the second LLR values,
wherein the means for adjusting is configured to adjust the first LLR values based on a first count of bits of the first portion that are erroneous and a second count of bits of the first portion that are erroneous and that are indicated as reliable.

17. The data storage device of claim 16, wherein the means for adjusting is further configured to adjust the first LLR values based on a third count of bits of the first portion that are correct and that are indicated as unreliable.

18. The data storage device of claim 16, further comprising means for receiving a request for the data from an access device, the representation of data read from the means for storing responsive to the request.

19. The data storage device of claim 16, wherein the second LLR values are set based on stored LLR values that correspond to the count of bits.

\* \* \* \* \*